United States Patent
Homma et al.

(10) Patent No.: US 10,725,388 B2
(45) Date of Patent: Jul. 28, 2020

(54) EXPOSURE APPARATUS AND METHOD OF MANUFACTURING ARTICLE

(71) Applicant: CANON KABUSHIKI KAISHA, Tokyo (JP)

(72) Inventors: Masato Homma, Utsunomiya (JP); Izumi Kawahara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/559,789

(22) Filed: Sep. 4, 2019

(65) Prior Publication Data

US 2020/0081354 A1    Mar. 12, 2020

(30) Foreign Application Priority Data

Sep. 10, 2018 (JP) ................................ 2018-169120
May 22, 2019 (JP) ................................ 2019-096250

(51) Int. Cl.
*G03F 7/20* (2006.01)

(52) U.S. Cl.
CPC ................................ *G03F 7/70716* (2013.01)

(58) Field of Classification Search
CPC ............. G03F 7/70358; G03F 7/70716; G03F 7/70908; G03F 7/70341
USPC ............................................... 355/30, 72–76
See application file for complete search history.

(56) References Cited

U.S. PATENT DOCUMENTS

| | | | |
|---|---|---|---|
| 6,542,220 B1 * | 4/2003 | Schrijver | G03F 7/70716 355/53 |
| 6,891,593 B2 * | 5/2005 | Arakawa | G03F 7/70525 355/30 |
| 6,954,255 B2 * | 10/2005 | Hasegawa | G03F 7/70358 355/30 |
| 9,081,311 B2 * | 7/2015 | Vogel | G03F 7/70908 |
| 9,874,823 B2 | 1/2018 | Shibazaki | |
| 2012/0249983 A1 | 10/2012 | Vogel | |
| 2013/0010270 A1 | 1/2013 | Van Boxtel | |

FOREIGN PATENT DOCUMENTS

| | | |
|---|---|---|
| JP | 2015228519 A | 12/2015 |
| WO | 2014128232 A1 | 8/2014 |

OTHER PUBLICATIONS

Extended European Search Report issued in European Appln. No. 19192535.3 dated Dec. 13, 2019.

* cited by examiner

*Primary Examiner* — Hung Nguyen (74) *Attorney, Agent, or Firm* — Rossi, Kimms & McDowell LLP (57) ABSTRACT

The present invention provides an exposure apparatus which exposes a substrate while scanning an original and the substrate, comprising: a stage that includes a first surface in which a first concave portion and a second concave portion to be supplied with a purge gas are formed, and is movable while holding the original; and a member including a second surface facing the first surface, wherein the first concave portion is provided in the first surface of the stage so as to define a first space in which the original is arranged, and at least one second concave portion is provided outside the first concave portion in the first surface of the stage so as to define a second space having a smaller volume than the first space.

24 Claims, 8 Drawing Sheets

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

As one type of apparatus used in the manufacturing process (lithography process) of a liquid crystal panel or a semiconductor device, there is an exposure apparatus which projects the pattern of an original illuminated by an illumination optical system onto a substrate and exposes the substrate. It is known that an original (mask or reticle) used in the exposure apparatus fogs, for example, by reacting with an acid, a base, or an organic impurity in an atmosphere existing around the original. It is also known that the fogging of the original is accelerated by moisture in the atmosphere. When the original fogs in this manner, problems such as insufficient exposure occur, that may make it difficult to accurately transfer the pattern of the original onto the substrate. Accordingly, in the exposure apparatus, it is desirable to fill a space in which the original is arranged with a purge gas whose impurities and humidity have been adjusted (reduced). Japanese Patent Laid-Open No. 2015-228519 proposes an arrangement in which a movable region of an original stage holding an original is covered with a plate, and a purge gas with reduced impurities and humidity is supplied to the internal space formed by the plate.

In the exposure apparatus, it is desired to reduce the use amount of the purge gas from the viewpoint of running cost and the like. However, the invention described in Japanese Patent Laid-Open No. 2015-228519 has the arrangement in which the entire movable region of the original stage is covered with the plate, so the internal space formed by the plate is very large compared with the volume of the original. Therefore, in order to prevent intrusion of the outside air into the internal space formed by the plate, a large amount of the purge gas needs to be continuously supplied to the internal space, which is disadvantageous for reducing the use amount of the purge gas.

SUMMARY OF THE INVENTION

The present invention provides an advantageous technique, for example, in terms of the amount of a purge gas used to fill a space in which an original is placed.

According to one aspect of the present invention, there is provided an exposure apparatus which exposes a substrate while scanning an original and the substrate, comprising: a stage that includes a first surface in which a first concave portion and a second concave portion to be supplied with a purge gas are formed, and is movable while holding the original; and a member including a second surface facing the first surface, wherein the first concave portion is provided in the first surface of the stage so as to define a first space in which the original is arranged, and at least one second concave portion is provided outside the first concave portion in the first surface of the stage so as to define a second space having a smaller volume than the first space.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

First Embodiment

[Arrangement of Exposure Apparatus]

Figure 1:
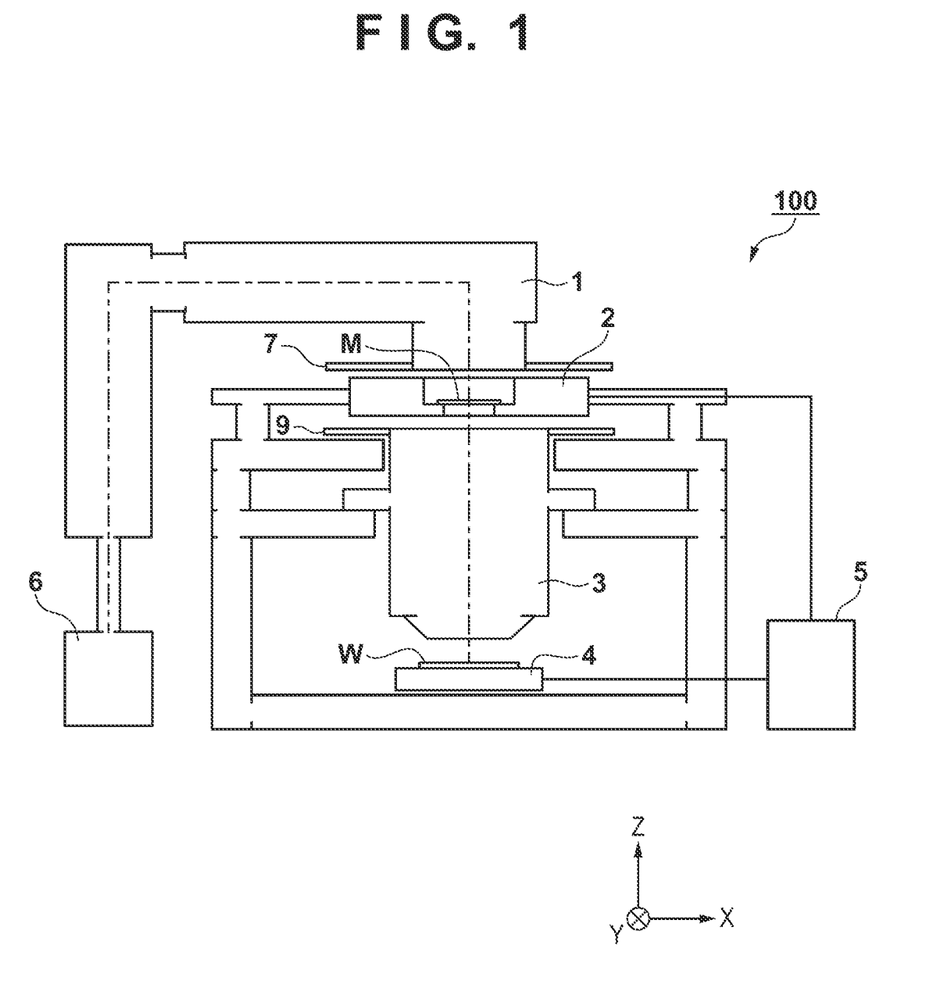
FIG. 1 is a view showing the overall arrangement of an exposure apparatus.

The first embodiment according to the present invention will be described. FIG. 1 is a view showing the overall arrangement of an exposure apparatus 100 of this embodiment. The exposure apparatus 100 of this embodiment is a step-and-scan exposure apparatus that exposes a substrate W while scanning an original M and the substrate W, thereby transferring the pattern of the original M onto the substrate. The exposure apparatus 100 is also be called a scanning exposure apparatus or a scanner. In this embodiment, the original M is, for example, a mask (reticle) made of quartz, on which a circuit pattern to be transferred onto each of a plurality of shot regions on the substrate W has been formed. The substrate W is a wafer coated with a photoresist and, for example, a single crystal silicon substrate or the like can be used.

The exposure apparatus 100 can include an illumination optical system 1, an original stage 2 that can move while holding the original M, a projection optical system 3, a substrate stage 4 that can move while holding the substrate W, and a control unit 5. The control unit 5 is formed by, for example, a computer that includes a CPU and a memory, and is electrically connected to respective units in the apparatus, thereby comprehensively controlling the overall operation of the apparatus. Here, in the following description, a direction parallel to the optical axis of light emitted from the illumination optical system 1 and strikes the original M is assumed to be the Z direction, and two directions orthogonal to each other in a plane perpendicular to the optical axis are assumed to be the X direction and the Y direction, respectively.

The illumination optical system 1 shapes light emitted from a light source 6 such as a mercury lamp, an ArF excimer laser, or a KrF excimer laser into, for example, band-like or arcuate slit-shaped light and illuminates a portion of the original M with this slit-shaped light. The light transmitted through the portion of the original M enters the projection optical system 3 as a pattern light reflecting the pattern of the portion of the original M. The projection optical system 3 has a predetermined projection magnification, and projects the pattern of the original M onto the substrate (more specifically, the resist on the substrate) by using the pattern light. The original M and substrate W are respectively held by the original stage 2 and substrate stage 4, and are arranged in optically conjugate positions (the object plane and image plane of the projection optical system 3) via the projection optical system 3. The control unit 5 relatively scans the original stage 2 and substrate stage 4 in synchronism with each other at a velocity ratio matching the projection magnification of the projection optical system (in this embodiment, the scanning direction of the original M and that of the substrate W are assumed to be the X direction (first direction)). With this arrangement, the pattern of the original M can be transferred onto the substrate.

[Peripheral Arrangement of Original Stage]

In general, it is known that the original M used in the exposure apparatus fogs, for example, by reacting with an acid, a base, or an organic impurity in an atmosphere existing around the original M. It is also known that such fogging of the original M is accelerated by moisture in the atmosphere. When the original M fogs in this manner, problems such as insufficient exposure occur, that may make it difficult to accurately transfer the pattern of the original M onto the substrate. Accordingly, in the exposure apparatus, it is desirable to fill a space in which the original M is arranged with a purge gas whose impurities and humidity have been adjusted (reduced). Furthermore, in the exposure apparatus, it is desired to reduce the use amount of the purge gas from the viewpoint of running cost and the like. Therefore, the exposure apparatus 100 of this embodiment is configured to fill the space in which the original M is arranged with a purge gas and to be able to reduce the use amount of the purge gas at that time. Here, a purge gas is a gas adjusted to reduce an acid, a base, an organic impurity, and also humidity, and for example, clean dry air or a nitrogen gas can be used.

Figure 2A:
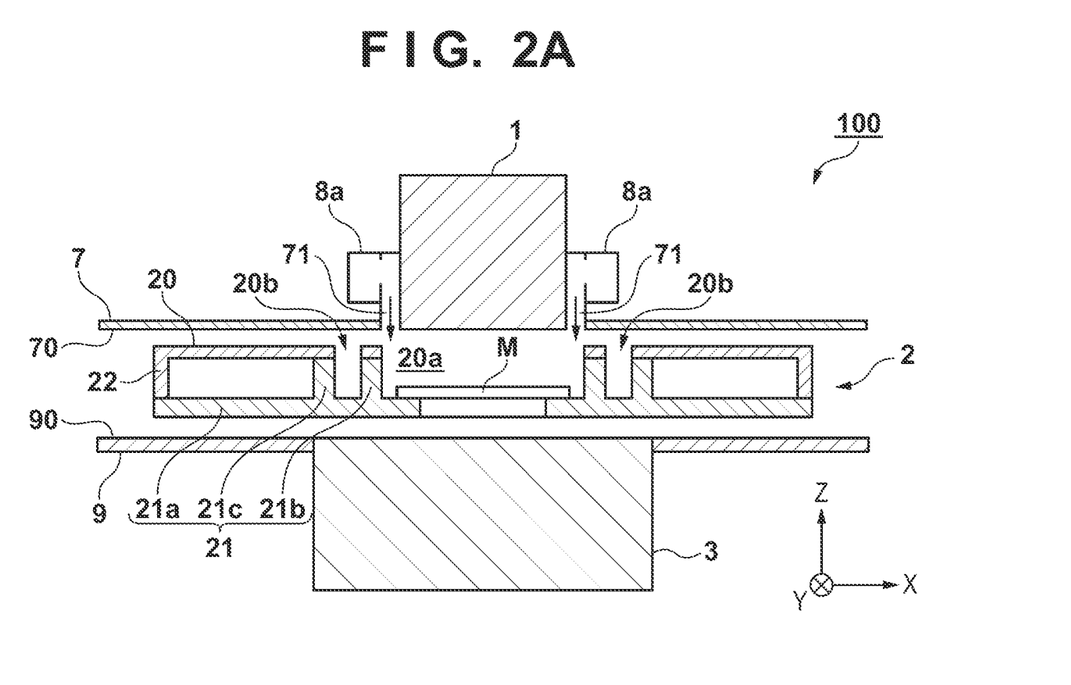
FIGS. 2A and 2B are views showing the peripheral arrangement of an original stage according to the first embodiment.
Figure 2B:
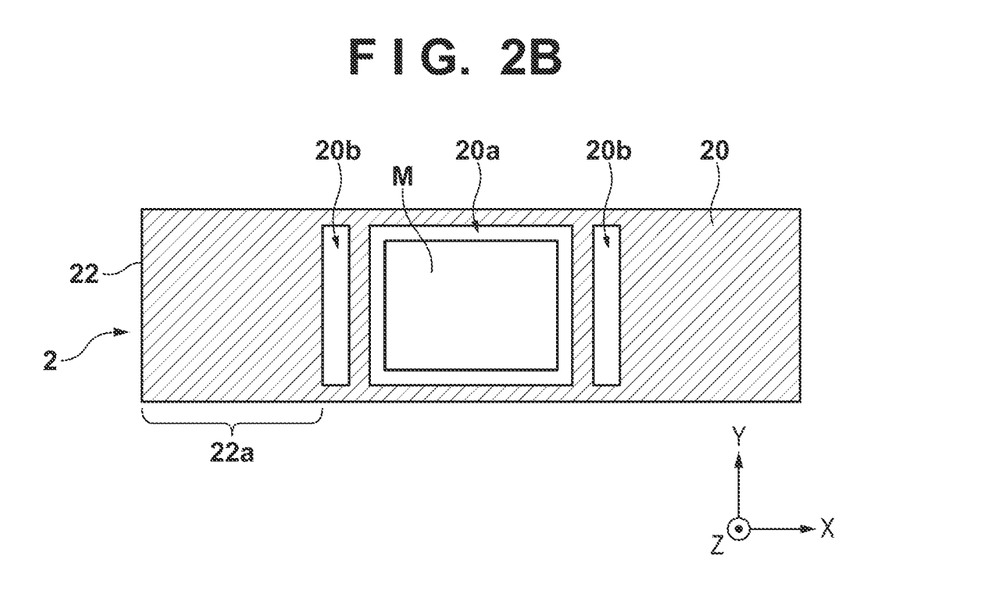

The detailed arrangement of the exposure apparatus 100 of this embodiment will be described below. FIGS. 2A and 2B are views showing the peripheral arrangement of the original stage 2 in the exposure apparatus 100 of this embodiment. FIG. 2A is a view showing the peripheral arrangement (X-Z section) of the original stage 2 in the exposure apparatus 100, and the illumination optical system 1, the original stage 2, the projection optical system 3, a second plate 7, and supply units 8a (first supply units) are illustrated. FIG. 2B is a view of the original stage 2 of this embodiment as viewed from above (the +Z direction side).

First, the arrangement of the original stage 2 will be described. As shown in FIGS. 2A and 2B, the upper surface (a first surface 20) of the original stage 2 is formed with a first concave portion 20a and second concave portions 20b to which a purge gas is supplied from the supply units 8a to be described later. The first concave portion 20a is provided in the upper surface (first surface 20) of the original stage 2 so as to define the first space (original arrangement space) in which the original M is arranged. The first concave portion 20a can be formed to have a dimension larger than the original M when the original stage 2 is viewed from above, and to have a depth equal to or larger than the thickness of the original M.

Each of the second concave portions 20b is provided outside the first concave portion 20a in the upper surface (first surface 20) of the original stage 2 so as to define the second space having a smaller volume than the first space. In this embodiment, a plurality of second concave portions 20b are provided so as to sandwich the first concave portion 20a in the scanning direction (±X directions, or may be simply referred to as a "scanning direction", hereinafter) of the original stage 2 during scanning exposure. That is, the second concave portions 20b are provided in the scanning direction (on the ±X direction sides) of the first concave portion 20a in the upper surface of the original stage.

The second concave portion 20b is arranged such that the length in the scanning direction (X direction) is smaller than the length in a direction (±Y directions, or may be simply referred to as a "vertical direction", hereinafter) perpendicular to the scanning direction when the original stage 2 is viewed from above. That is, the second concave portion 20b is a groove portion extending in the upper surface of the original stage 2 along the vertical direction (Y direction). The second concave portion 20b of this embodiment has a rectangular shape whose longitudinal direction is the vertical direction (Y direction), but its shape is not limited to this, and may have a curved shape.

Here, the detailed arrangement of the original stage 2 will be described. The original stage 2 can include, for example, a holding portion 21 that holds the original M, and a first plate 22 that forms the upper surface (first surface 20) of the original stage 2.

The holding portion 21 is formed by a base 21a, first protrusion portions 21b, and second protrusion portions 21c, and can be driven in at least the ±X directions by a drive mechanism (not shown) such as a linear motor. The base 21a is configured to hold the peripheral region of the original M by vacuum suction, electrostatic attraction, or the like, and an opening is formed in the portion where the central region (the region where a circuit pattern is formed) of the original M is arranged so that light transmitted through the original M enters the projection optical system. The opening may be provided with, for example, a transparent member such as glass.

Each of the first protrusion portions 21b is a portion protruding upward (in the +Z direction) from the base 21a in the periphery of the original M such that the first concave portion 20a (first space) is defined using the base 21a as the bottom and the first protrusion portions 21b as the sidewalls. The first protrusion portion 21b can be arranged to have a height equal to or larger than the thickness of the original M. Each of the second protrusion portions 21c is a portion protruding upward (in the +Z direction) from the base 21a outside the first protrusion portion 21b such that the second concave portion 20b (second space) is defined using the base 21a as the bottom and the first protrusion portion 21b and the second protrusion portion 21c as the sidewalls. The second protrusion portion 21c can be arranged to have the same height as the first protrusion portion 21b. That is, the second concave portion 20b can be arranged to have the same depth as the first concave portion 20a. Here, the depth of the second concave portion 20b may be equal to or smaller than the depth of the first concave portion 20a.

The first plate 22 is a member including the first surface 20 perpendicular to the optical axis direction of light emitted from the illumination optical system 1, and forms the upper surface of the original stage 2 by the first surface 20. The first plate 22 is connected to the ends of the first protrusion portions 21b and the second protrusion portions 21c of the holding portion 21, and arranged to include extending regions 22a each of which extends from the end of the second protrusion portion 21c along the scanning direction. In addition, the first plate 22 is provided with openings at a portion where the first concave portion 20a (first space) is formed and at portions where the second concave portions 20b (second spaces) are formed. Note that although the sheet-like first plate 22 is used as a member including the first surface 20 in this embodiment, the member other than a sheet-like plate may be used.

Here, the first plate 22 can be arranged to be able to reduce the outside air flowing into the first concave portion 20a and the second concave portions 20b from the gap between the extending regions 22a and the second plate 7 to be described later, along with movement of the original stage 2 during scanning exposure. For example, the first plate 22 can be arranged to include, in each of the extending regions 22a, a portion where the distance with the second plate 7 (a second surface 70) to be described later is smallest. In addition, the extending region 22a can be provided such that the length in the scanning direction is equal to or larger than the half of the moving stroke (moving distance) of the original stage 2 at the time of scanning exposure, and more preferably equal to or larger than the length of the moving stroke. That is, the second concave portion can be provided so as not to fall outside the outer shape of the second plate 7 during movement of the original stage 2.

Next, the second plate 7 and the supply units 8a will be described.

The second plate 7 is a member including the second surface 70 perpendicular to the optical axis direction of light emitted from the illumination optical system 1, and arranged above the original stage 2 to be spaced apart from the original stage 2 such that the second surface 70 faces the first surface 20 of the original stage 2 (first plate). The second plate 7 is provided, for example, in the illumination optical system 1 or another structure so as not to move together with the original stage 2. In this embodiment, the second plate 7 is fixed to the illumination optical system 1.

In addition, the second plate 7 can be arranged such that a gap between the first surface 20 of the original stage 2 (first plate 22) and the second surface 70 of the second plate 7 is as small as possible (that is, a minute gap is formed). With this arrangement, it is possible to alleviate a temporal change in air pressure in the second concave portion 20b which occurs when the purge gas supplied to the second concave portion 20b escapes through the gap between the first surface 20 and the second surface 70. For example, the second plate 7 can be arranged such that the gap between the first surface 20 and the second surface 70 is as small as possible to such an extent that the first surface 20 and the second surface 70 do not contact with each other even by vibration (in the ±Z directions) during movement of the original stage 2. As an example, the second plate 7 can be arranged such that the distance between the first surface 20 and the second surface 70 is equal to or smaller than the length of the second concave portion 20b in the scanning direction. Note that although the sheet-like second plate 7 is used as a member including the second surface 70 in this embodiment, the member other than a sheet-like plate may be used, or the member may be formed by a portion of the structure of the illumination optical system 1.

Each of the supply units 8a supplies a purge gas to the space between the first plate 22 and the second plate 7, and to the first concave portion 20a and the second concave portions 20b of the original stage 2. For example, the supply unit 8a is configured to blow out the purge gas from an outlet 71 provided in the second plate 7 (second surface 70), thereby supplying the purge gas to the first concave portion 20a and the second concave portions 20b during movement of the original stage 2. In this embodiment, multiple (two) outlets 71 for the purge gas are provided so as to sandwich the illumination optical system 1 in the scanning direction.

[Supply of Purge Gas to Original Stage]

Figure 3A:
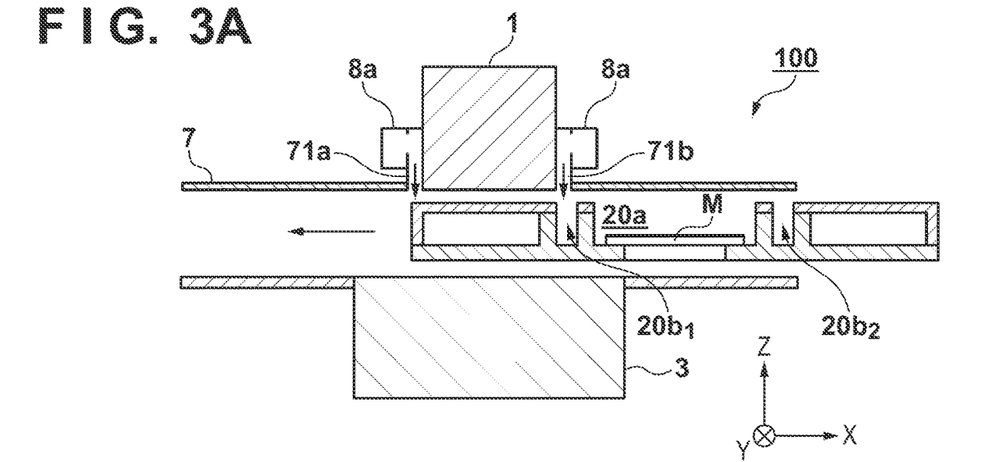
FIGS. 3A to 3C are views for explaining supply of a purge gas at the time of scanning exposure.
Figure 3B:
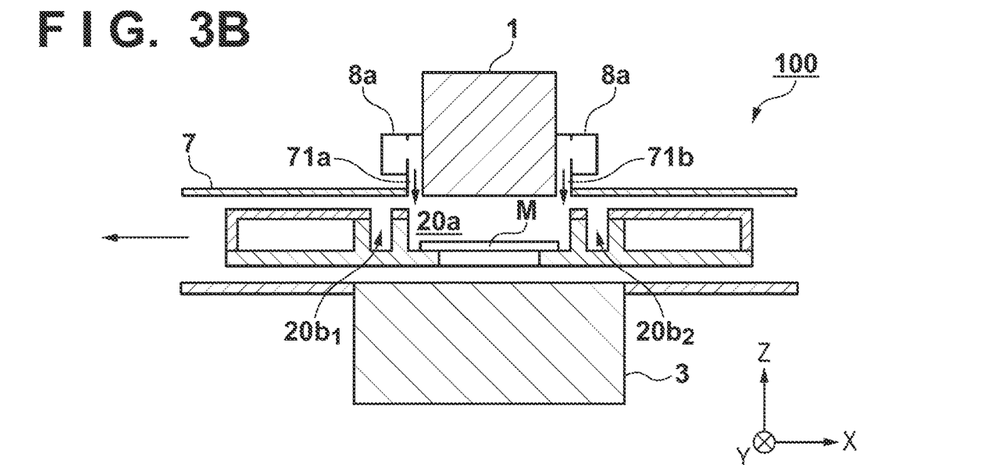
Figure 3C:
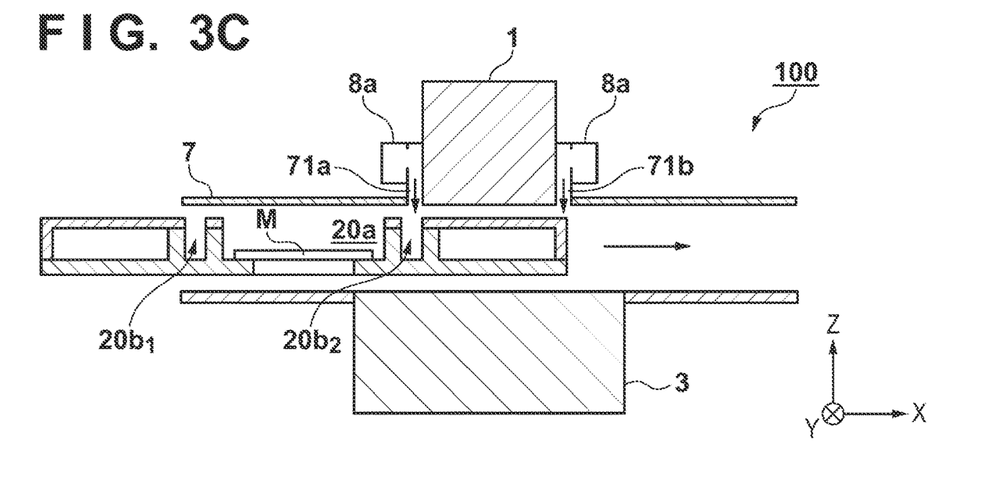

FIGS. 3A to 3C are views for explaining supply of the purge gas to the original stage 2 (the first concave portion 20a and the second concave portions 20b) at the time of scanning exposure. First, as shown in FIG. 3A, the original stage 2 is driven such that a second concave portion $20b_1$ on the −X direction side is arranged below an outlet 71b on the +X direction side. At this time, the purge gas is supplied from the outlet 71b to the second concave portion $20b_1$ on the −X direction side from the supply unit 8a, so that the second concave portion $20b_1$ is filled with the purge gas and the air pressure therein becomes higher than the air pressure outside the original stage 2. In this state, the purge gas supplied to the second concave portion $20b_1$ gradually escapes through the gap between the first surface 20 and the second surface 70, making it possible to prevent the outside air flowing through the gap. In addition, when the original stage 2 is moved in the −X direction in this state, the outside air can intrude through the gap between the first surface 20 and the second surface 70 along with the movement of the original stage 2, but the outside air can flow into the concave portion 20b and be diluted before flowing into the first concave portion 20a. That is, the flow of the outside air into the first concave portion 20a can be reduced (prevented).

Then, as shown in FIG. 3B, the original stage 2 is driven such that the original M is arranged below the illumination optical system 1, and scanning exposure is performed while moving the original stage 2 in the −X direction. While the original stage 2 moves from the state shown in FIG. 3A to the state shown in FIG. 3B, the second concave portion $20b_1$ is filled with the purge gas supplied from an outlet 71a of the supply unit 8a. Since the second concave portion $20b_1$ is filled with the purge gas, the air pressure therein becomes higher than the air pressure outside the original stage 2. At this time, the first concave portion 20a is arranged below the outlets 71 (71a and 71b), and supplied with the purge gas from the outlets 71 (71a and 71b) by the supply units 8a. Therefore, the first concave portion 20a is filled with the purge gas and has the air pressure higher than the air pressure outside the original stage 2, making it possible to prevent the outside air flowing into the first concave portion 20a through the gap between the first surface 20 and the second surface 70.

When the scanning exposure (scanning of the original stage 2) in the −X direction is completed, scanning exposure (scanning of the original stage 2) in the reverse direction (+X direction) is performed. Accordingly, as shown in FIG. 3C, the original stage 2 is driven such that the second concave portion $20b_2$ on the +X direction side is arranged below the outlet 71a on the −X direction side. At this time, similarly to the state shown in FIG. 3A, the purge gas is supplied from the outlet 71a to the second concave portion $20b_2$ on the +X direction side from the supply unit 8a, so that the air pressure therein becomes higher than the air pressure outside the original stage 2. In this state, similar to the state described with reference to FIG. 3A, it is possible to prevent the outside air flowing through the gap, and it is also possible to reduce (prevent) the outside air flowing into the first concave portion 20a through the gap between the first surface 20 and the second surface 70 along with movement of the original stage 2. Then, the original stage 2 is driven such that the original M is arranged below the illumination optical system 1, and scanning exposure is performed while moving the original stage 2 in the +X direction. While the original stage 2 moves from the state shown in FIG. 3C in the +X direction, the second concave portion $20b_2$ is filled with the purge gas supplied from the outlet 71b of the supply unit 8a. Since the second concave portion $20b_2$ is filled with the purge gas, the air pressure therein becomes higher than the air pressure outside the original stage 2.

In this manner, in the original stage 2 of the this embodiment, the second concave portions 20b (second spaces) are provided in the scanning direction of the first concave portion 20a (first space) where the original M is arranged, and the second concave portion 20b is used as a space for reducing (preventing) the flow of the outside air into the first concave portion 20a. Accordingly, the second concave portions 20b can be arranged on both sides of the first concave portion 20a in the scanning direction (±X directions), but the second concave portion 20b may be arranged on only one side. Note that when the second concave portion 20b is arranged on only one side of the first concave portion 20a, the effect thereof can be halved. However, in an environment in which the flow of the outside air around the original stage 2 is an extremely large tailwind or headwind relative to the moving speed of the original stage 2, a sufficient effect can be expected by providing only one second concave portion 20b on the side where the inflow of the outside air should be prevented.

Further, from the viewpoint of preventing the flow of the outside air into the first concave portion 20a by the second concave portion 20b, the length in the vertical direction (Y direction) of the second concave portion 20b can be equal to or larger than the length of the first concave portion 20a in the vertical direction. The second concave portion 20b can have a volume that allows the second concave portion 20b to be filled with the purge gas with the flow rate of the purge gas supplied from the supply unit 8a via the outlet 71 during scanning of the original stage 2. Within this range, the length in the scanning direction, length in the vertical direction, and depth of the second concave portion 20b can be determined.

In the exposure apparatus 100 of this embodiment, if the air pressure is increased only at a local part of the second concave portion 20b, the outside air may flow into the first concave portion 20a through the part where the air pressure is not increased. Therefore, it is desirable that in the vertical direction, the range in which the purge gas is supplied from the supply unit 8a via the outlet 71 and the range (length) of the second concave portion 20b are approximately equal (for example, coincident) so that the air pressure in the second concave portion 20b becomes uniformly high as a whole. That is, in the vertical direction, the range of the outlet 71 provided in the second plate 7 can be equal to or larger than the range of the second concave portion 20b so that the purge gas is uniformly supplied to the second concave portion 20b. Furthermore, the outlets 71 can be provided in the second plate 7 so as to be symmetric with respect to the center position of the movement range of reciprocation of the original stage 2.

Here, the effect of providing the second concave portion 20b in the original stage 2 will be described. When the second concave portion 20b is not provided in the original stage 2, it is necessary to supply the purge gas to the first concave portion 20a so as to increase the air pressure in the first concave portion 20a to a level capable of filling the first concave portion 20a with the purge gas and reducing the flow of the outside air into the first concave portion 20a. In this case, since the first concave portion 20a has a larger volume than the second concave portion 20b, a large amount of purge gas is required to increase the air pressure in the first concave portion 20a to such a level. On the other hand, when the second concave portion 20b having a smaller volume than the first concave portion 20a is provided in the scanning direction of the first concave portion 20a as in this embodiment, it is possible to increase the air pressure in the second concave portion 20b with the smaller amount of the purge gas than that for increasing the air pressure in the first concave portion 20a. Since the second concave portion 20b having a high air pressure has a function of temporarily introducing thereto the outside air having passed through the gap between the first surface 20 and the second surface 70 to reduce the concentration of the outside air, the flow of the outside air into the first concave portion 20a can be reduced (prevented). That is, when the second concave portion 20b is provided in the original stage 2 as in this embodiment, the use amount of the purge gas can be reduced, and fogging of the original M can be prevented by reducing (preventing) the flow of the outside air into the first concave portion 20a.

100401 [Specific Example of Peripheral Arrangement of Original Stage]

Next, a specific example of the peripheral arrangement of the original stage 2 will be described. For example, the moving speed of the original stage 2 ranges from low speed such as 100 mm/s to high speed such as 10,000 mm/s, and the moving stroke of the original stage 2 ranges from several tens of mm to several m. The distance between the first surface 20 and the second surface 70 ranges from several μm to several mm. The width of the original stage 2 in the vertical direction ranges from several tens of mm to about 1 m. The flow rate of the purge gas supplied from the supply unit 8a via the outlet 71 ranges from several tens of L/min to several thousand L/min.

In such a scale, the second concave portion 20b can have a volume that allows the second concave portion 20b to be filled with the purge gas with the flow rate of the purge gas supplied from the supply unit 8a via the outlet 71 during scanning of the original stage 2. For example, it is desirable that a volume V of the second concave portion 20b is in the relation of $V \leq V1+V2$. Here, "V1" is the volume of the gas supplied from the outlet 71 while the second concave portion 20b is passing below the outlet 71, and "V2" is the volume of the gas supplied from the outlet 71 when the second concave portion 20b is not passing below the outlet 71. Within this range, the length in the scanning direction, length in the vertical direction, and depth of the second concave portion 20b can be determined. Note that the depth of the second concave portion 20b can be equal to or larger than the thickness of the original M. In addition, the depth of the second concave portion 20b can be approximately equal to the depth of the first concave portion 20a, and more preferably larger than the depth of the first concave portion 20a.

Even when the second concave portion 20b has a volume that cannot be filled with the purge gas while the original stage 2 is moving, the function of the second concave portion 20b, such as reducing the concentration of the outside air by temporarily introducing the outside air thereto, can be maintained. A preferred condition for the function of the second concave portion 20b, such as reducing the concentration of the outside air by temporarily introducing the outside air thereto, can be in the relation of $d \times W \times L \leq V$. Here, "V" is the volume of the second concave portion 20b, "d" is the distance between the first surface 20 and the second surface 70, "W" is the length of the second concave portion 20b in the vertical direction, and "L" is a distance of scanning movement while the outlet 71 is located inside the second concave portion.

Although the above is a preferable condition, depending on the shape of the second plate 7, the shape of the second concave portion 20b, the shape of the original stage 2, and the surrounding environment, there may be a more strict relation or a more moderate relation. For example, when the depth of the second concave portion 20b is extremely large with respect to the length in the scanning direction or the length in the vertical direction, or when the internal space of the second concave portion 20b is large with respect to the opening shape, the entire volume of the second concave portion 20b cannot be used effectively. Therefore, the relation may be more strict. Further, when the surrounding environment is an exhaust environment or when a local strong wind is blowing toward the original stage 2, the relation may be changed.

It is also desirable that the flow velocity of the purge gas escaping from the second concave portion 20b to the gap between the first surface 20 and the second surface 70 is higher than the moving speed of the original stage 2. A flow velocity v of the purge gas escaping from the second concave portion 20b to the gap having the distance d between the first surface 20 and the second surface 70 is expressed as approximately $v = F/\{(d \times W) \times 2 + (d \times D) \times 2\}$ where "D" is the length of the second concave portion 20b in the scanning direction, "W" is the length of the second concave portion 20b in the vertical direction, and "F" is the supply amount per unit time from the outlet 71. Accordingly, when the moving speed of the original stage 2 is set to be VR, it is desirable that the relation of $v \geq VR$ is satisfied. Therefore, the flow rate of the purge gas supplied from the supply unit 8a to the second concave portion 20b can be determined based on the opening shape of the second concave portion 20b, the distance d between the first surface 20 and the second surface 70, and the moving speed of the original stage 2. Even when the flow velocity of the purge gas escaping from the second concave portion 20b is not higher than the moving speed of the original stage 2, the function of the second concave portion 20b, such as reducing the concentration of the outside air by temporarily introducing the outside air thereto, can be maintained.

Furthermore, the length of the second concave portion 20b in the vertical direction can be equal to or larger than the length of the first concave portion 20a in the vertical direction. With this arrangement, the second concave portion 20b can reduce (prevent) the inflow of the outside air, which is flowing in from the scanning direction side of the original stage 2, to the first concave portion 20a. Note that depending on the length of the second concave portion 20b in the vertical direction, the effect of preventing the flow of the outside air into the first concave portion 20a can change. For example, when the length in the vertical direction of the second concave portion 20b is 50% of the length of the first concave portion 20a in the vertical direction, the effect of preventing the flow of the outside air into the first concave portion 20a can also decrease to 50%. Here, the length of the opening shape of the outlet 71 in the vertical direction can be equal to the length of the second concave portion 20b in the vertical direction. However, the length of the opening shape of the outlet 71 in the vertical direction may be smaller than the length of the second concave portion 20b in the vertical direction as long as supply to the entire second concave portion is possible.

Next, the effects of the exposure apparatus 100 of this embodiment arranged under the above conditions will be described. As an example, when the flow rate of the purge gas supplied from the supply unit 8a was set to 500 L/min, the humidity in the first concave portion 20a was 0.15% RH, while the humidity outside the original stage 2 was 50% RH. On the other hand, in the arrangement in which no second concave portion 20b was provided, the humidity in the first concave portion 20a was 1.5% even when the flow rate of the purge gas supplied from the supply unit 8a was increased to 550 L/min. This result also shows that when the second concave portion 20b is provided in the original stage 2 as in this embodiment, the flow of the outside air into the first concave portion 20a can be prevented (reduced), and the use amount of the purge gas can be reduced.

Here, in the space outside the original stage 2, a measurement unit (for example, a laser interferometer) that measures the position of the original stage 2 can be provided in order to control the position of the original stage 2. In such a measurement unit, when the optical path environment, such as temperature, air pressure, humidity, or the like, of the laser light changes, a measurement error may occur accordingly. That is, when a large amount of the purge gas supplied to the first concave portion 20a and the second concave portion 20b flows out to the space outside the original stage 2, the optical path environment of the laser light changes accordingly, and a measurement error may occur. In the arrangement of the exposure apparatus 100 of this embodiment, since the use amount of the purge gas can be reduced, such a measurement error can also be reduced.

Second Embodiment

Figure 4A:
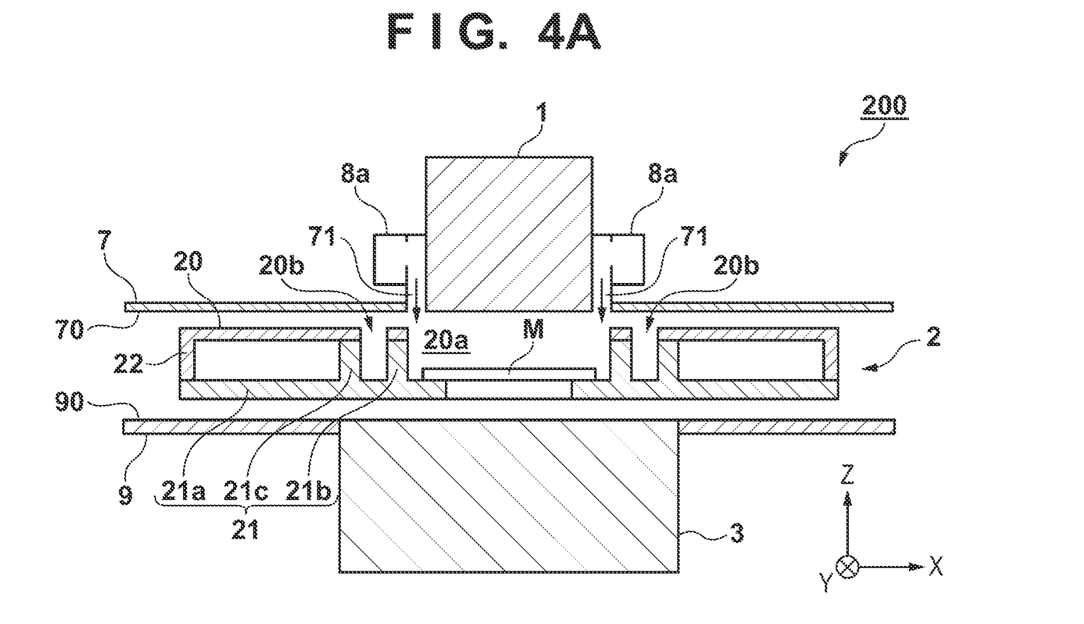
FIGS. 4A and 4B are views showing the peripheral arrangement of an original stage according to the second embodiment.
Figure 4B:
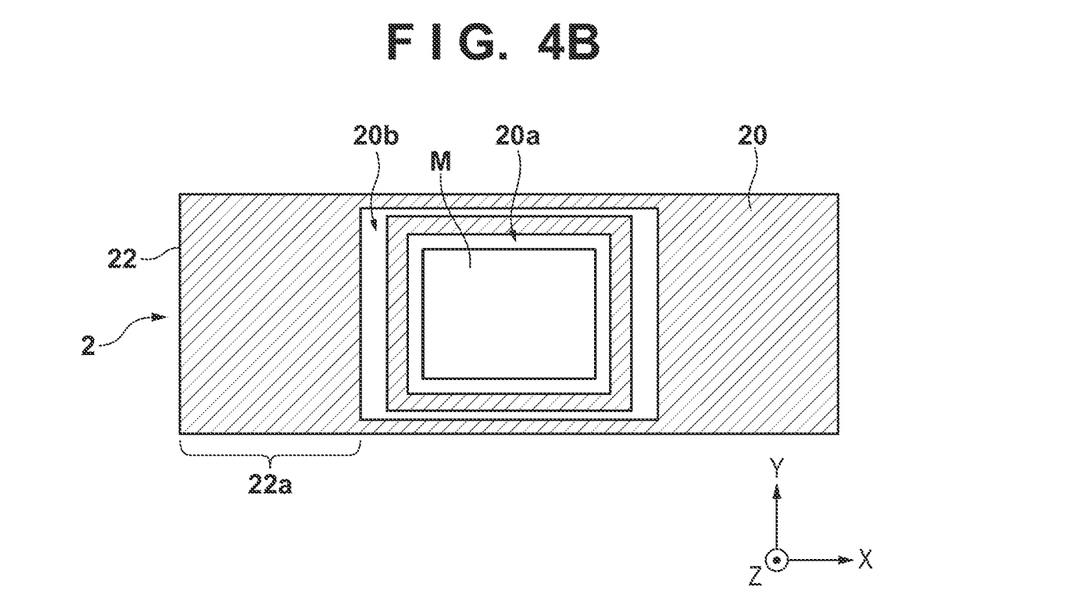

The second embodiment according to the present invention will be described. FIGS. 4A and 4B are views showing the peripheral arrangement of an original stage 2 in an exposure apparatus 200 of this embodiment. FIG. 4A is a view showing the peripheral arrangement (X-Z section) of the original stage 2 in the exposure apparatus 200, and an illumination optical system 1, the original stage 2, a projection optical system 3, a second plate 7, and supply units 8a are illustrated. FIG. 4B is a view of the original stage 2 of this embodiment as viewed from above (the +Z direction side). Note that the parts not particularly mentioned in the following description are similar to those in the first embodiment.

The exposure apparatus 200 of this embodiment is characterized in that the shape of a second concave portion 20b (second space) is different from that in the first embodiment. In this embodiment, the second concave portion 20b is provided in the original stage 2 (a first plate 22 or a first surface 20) so as to surround the outside of a first concave portion 20a (first space). The second concave portion 20b may be formed as a groove portion having the same width on the scanning direction side and the vertical direction side of the first concave portion 20a, or may be formed as a groove portion having different widths on the scanning direction side and the vertical direction side of the first concave portion 20a. In addition, the second concave portion 20b may be formed as one continuous groove portion, or may be formed as several groove portions separated from each other. Also in the second concave portion 20b of this embodiment, as described in the first embodiment, the second concave portion 20b can be filled with a purge gas to increase the air pressure, and the outside air can be temporarily introduced to the second concave portion 20b to reduce the concentration of the outside air. Thus, the outside air flowing into the first concave portion 20a can be reduced (prevented).

In the original stage 2 of this embodiment, the inflow of the outside air from the vertical direction (±Y directions) can be reduced (prevented) by providing the second concave portion 20b so as to surround the outside of the first concave portion 20a. This is effective, for example, when the airflow from the vertical direction is large with respect to the original stage 2. In this case, the purge gas can be supplied from a supply unit 8a via an outlet 71 to a portion of the second concave portion 20b, that is arranged in the vertical direction of the first concave portion 20a, so that the portion is filled with the purge gas to increase the air pressure. That is, as for the shape of the second concave portion 20b, it is desirable that the length (width) in the scanning direction and the length (width) in the vertical direction are designed such that the air pressure in the second concave portion 20b becomes high. In addition, the shape of the second concave portion 20b can be designed such that the air pressure in the second concave portion 20b becomes high, depending on the arrangement space and arrangement position of the supply unit 8a.

In the original stage 2 of this embodiment, along with the provision of the second concave portion 20b also in the vertical direction, the use amount of the purge gas tends to be larger than that in the first embodiment and the arrangement space of the second concave portion 20b tends to be larger. In addition, when the second concave portion 20b is formed as one continuous groove portion, the volume of the second concave portion 20b becomes larger than that in the first embodiment, so that the amount of the purge gas used for filling the second concave portion 20b to increase the air pressure can become large. However, the second concave portion 20b is arranged such that the space (second space) defined thereby is smaller than the space (first space) defined by the first concave portion 20a. Therefore, compared with the arrangement in which only the first concave portion 20a is provided in the original stage 2 and the purge gas is supplied to the first concave portion 20a, it is possible to readily increase the air pressure in the second concave portion 20b with a smaller use amount of the purge gas, thereby efficiently reducing (preventing) the flow of the outside air into the first concave portion 20a. Even when the second concave portion 20b is formed by a plurality of groove portions (small spaces), the same effect can be obtained.

Third Embodiment

Figure 5A:
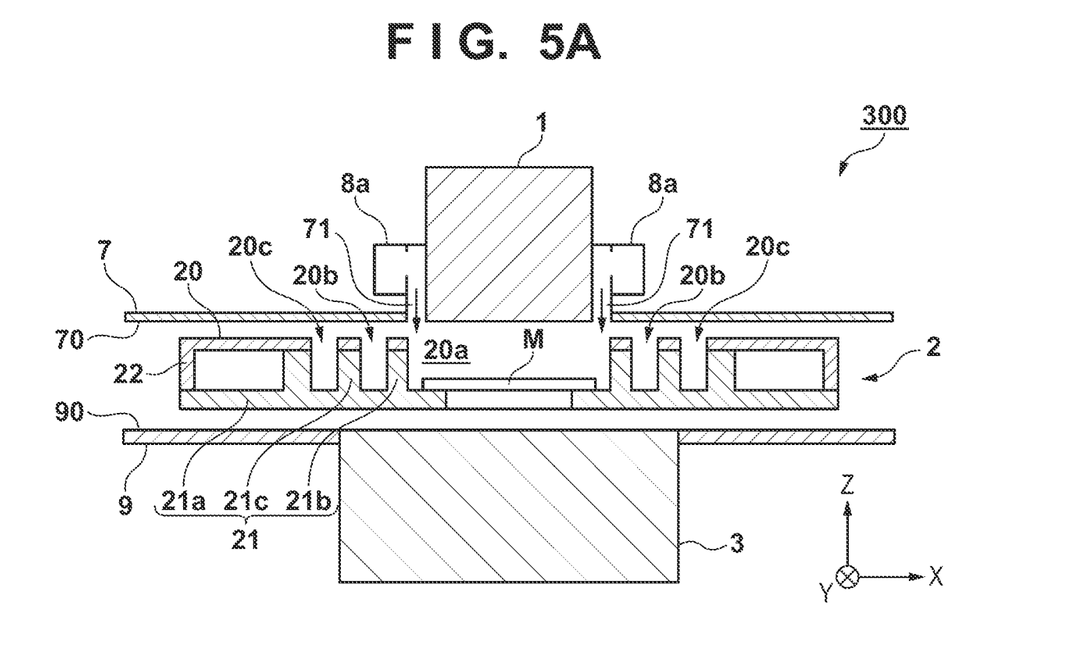
FIGS. 5A and 5B are views showing the peripheral arrangement of an original stage according to the third embodiment.
Figure 5B:
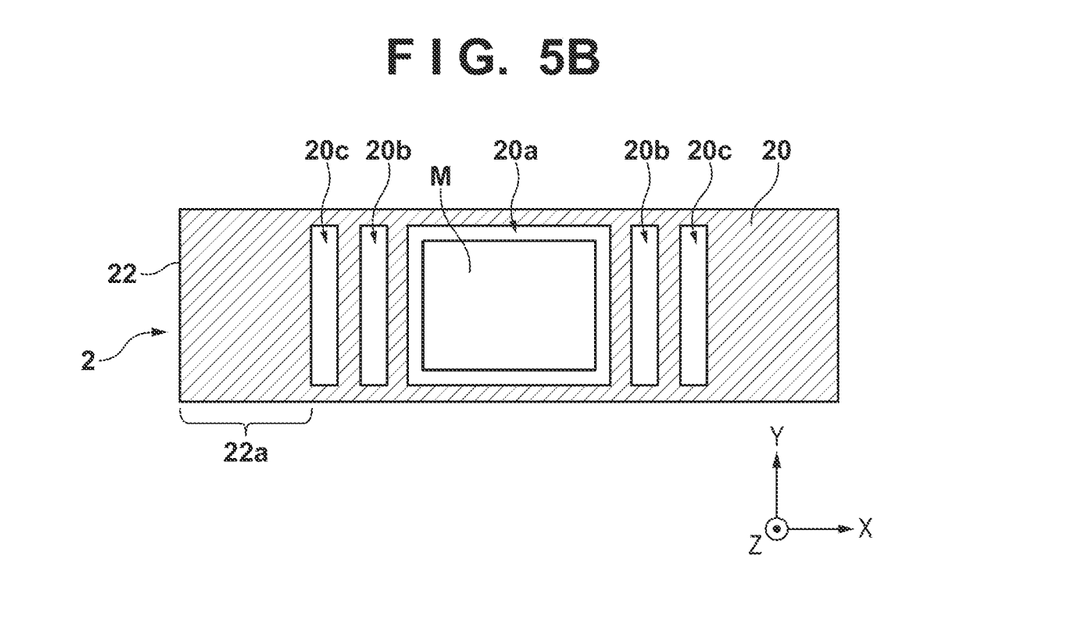

The third embodiment according to the present invention will be described. FIGS. 5A and 5B are views showing the peripheral arrangement of an original stage 2 in an exposure apparatus 300 of this embodiment. FIG. 5A is a view showing the peripheral arrangement (X-Z section) of the original stage 2 in the exposure apparatus 300, and an illumination optical system 1, the original stage 2, a projection optical system 3, a second plate 7, and supply units 8a are illustrated. FIG. 5B is a view of the original stage 2 of this embodiment as viewed from above (the +Z direction side). Note that the parts not particularly mentioned in the following description are similar to those in the first embodiment.

In the exposure apparatus 300 of this embodiment, compared with the first embodiment, second concave portions 20c (which may also be referred to as third concave portions 20c) are provided outside second concave portions 20b in the original stage 2 (a first plate 22 or a first surface 20). Each of the second concave portions 20c is formed in the original stage 2 as a groove portion defining the third space having a smaller volume than the first space (a first concave portion 20a), and is provided in the scanning direction of the second concave portion 20b. In this embodiment, multiple (two or more) second concave portions 20c are provided in the original stage 2 so as to sandwich the first concave portion 20a and the second concave portions 20b in the scanning direction (±X directions). Here, it is desirable that the second concave portion 20c have the same volume as the second concave portion 20b, or have a volume that allows the second concave portion 20c to be filled with the purge gas with the flow rate of the purge gas supplied from the supply unit 8a via the outlet 71 during scanning of the original stage 2. The shape of the second concave portion 20c may be the same as the shape of the second concave portion 20b.

In the original stage 2 of this embodiment, the flow of the outside air into the first concave portion 20a can be more efficiently reduced (prevented) by further providing the second concave portions 20c. This is effective particularly when the moving stroke of the original stage 2 in the scanning direction is large and the moving time is long. In the original stage 2 of this embodiment, while the original stage 2 moves, the purge gas is sequentially supplied from the supply unit 8a via the outlet 71 in the order of the second concave portion 20c, the second concave portion 20b, and the first concave portion 20a. Each of these portions is filled with the purge gas and the air pressure therein is increased in the above order. Thus, the outside air can be temporarily introduced to the second concave portion 20c to reduce the concentration of the outside air, and the outside air escaped from the second concave portion 20c can be temporarily introduced to the second concave portion 20b to further reduce the concentration of the outside air. That is, the outside air flowing into the first concave portion 20a can be more efficiently reduced (prevented). Furthermore, even when the second concave portion 20c is further provided in the original stage 2 as described above, it is unnecessary to change the position of the supply unit 8a (the outlet 71) as compared with the first embodiment. That is, in the exposure apparatus 300 of this embodiment, the effect of reducing the flow of the outside air into the first concave portion 20a can be further enhanced by changing only the arrangement of the original stage 2.

Fourth Embodiment

Figure 6A:
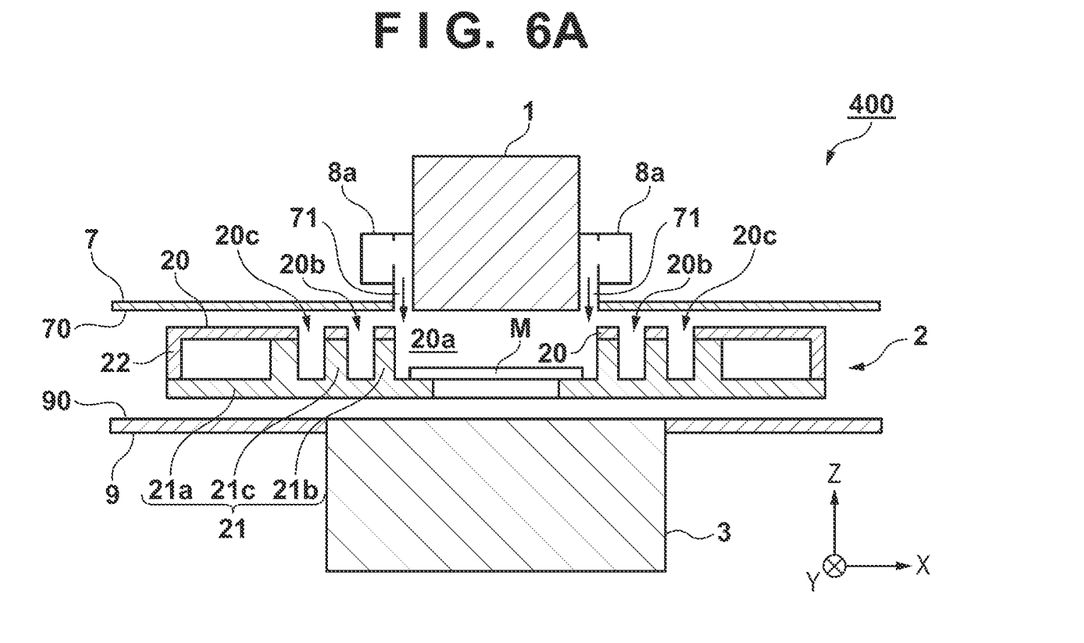
FIGS. 6A and 6B are views showing the peripheral arrangement of an original stage according to the fourth embodiment.
Figure 6B:
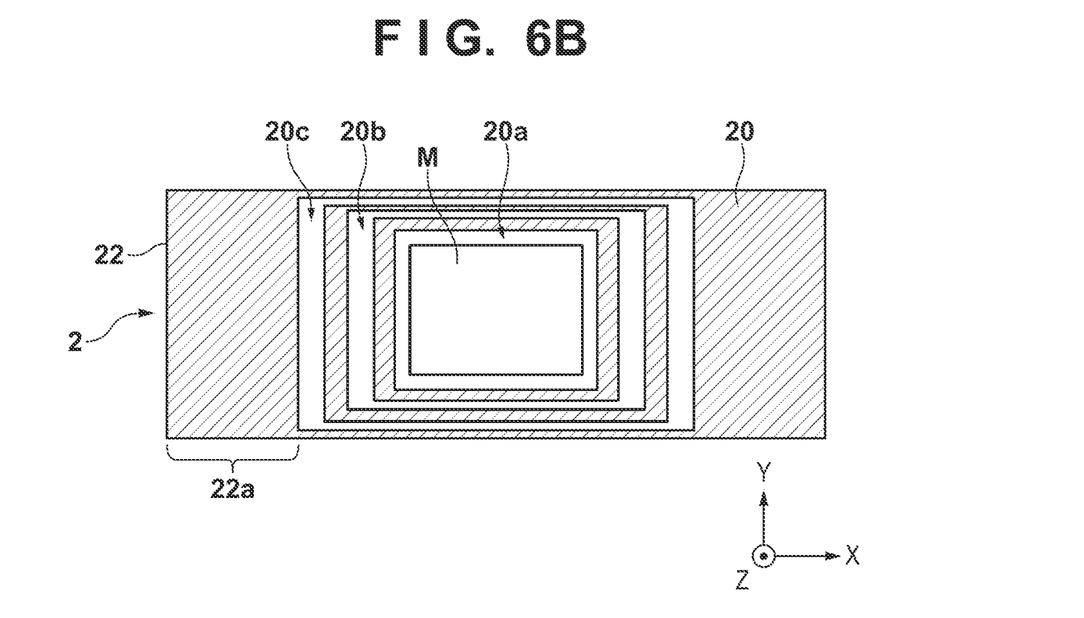

The fourth embodiment according to the present invention will be described. FIGS. 6A and 6B are views showing the peripheral arrangement of an original stage 2 in an exposure apparatus 400 of this embodiment. FIG. 6A is a view showing the peripheral arrangement (X-Z section) of the original stage 2 in the exposure apparatus 400, and an illumination optical system 1, the original stage 2, a projection optical system 3, a second plate 7, and supply units 8a are illustrated. FIG. 6B is a view of the original stage 2 of this embodiment as viewed from above (the +Z direction side). Note that the parts not particularly mentioned in the following description are similar to those in the first and second embodiments.

In the exposure apparatus 400 of this embodiment, compared with the second embodiment, a second concave portion 20c (which may also be referred to as a third concave portion 20c) is provided so as to surround the outside of a second concave portion 20b in the original stage 2 (a first plate 22 or a first surface 20). The second concave portion 20c is formed in the original stage 2 as a groove portion defining the third space having a smaller volume than the first space (a first concave portion 20a), and is provided so as to surround the outside of the second concave portion 20b. Here, the second concave portion 20c may have the same shape (width and depth) as the second concave portion 20b.

In the original stage 2 of this embodiment, the flow of the outside air into the first concave portion 20a can be more efficiently reduced (prevented) by further providing the second concave portion 20c, as in the third embodiment. In addition, in the original stage 2 of this embodiment, the second concave portion 20c is further provided so as to surround the outside of the second concave portion 20b, so that the inflow of the outside air from the vertical direction (±Y directions) can be more efficiently reduced (prevented) as compared with the second embodiment. Here, in the original stage 2 of this embodiment, in order to suppress an increase in use amount of the purge gas due to the provision of the second concave portion 20c as much as possible, the second concave portion 20c may be formed as a plurality of groove portions separated from each other. By forming the second concave portion 20c as a plurality of groove portions in this manner, it is possible to locally supply the purge gas from the supply unit 8a so as to locally increase the air pressure in the second concave portion 20c.

Fifth Embodiment

Figure 7A:
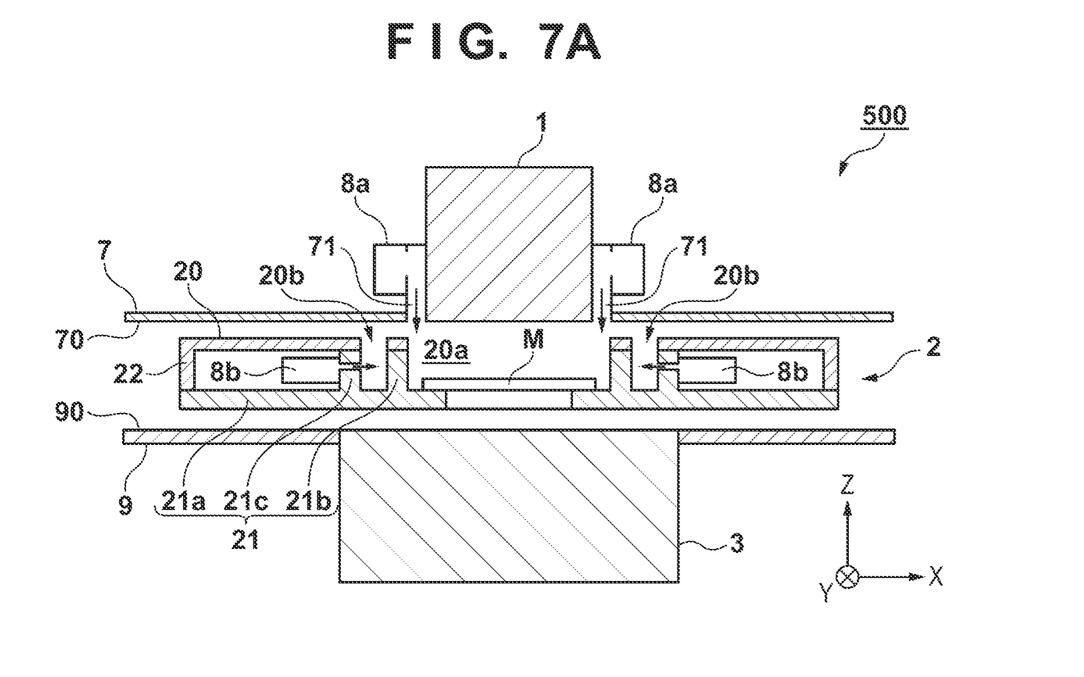
FIGS. 7A and 7B are views showing the peripheral arrangement of an original stage according to the fifth embodiment.
Figure 7B:
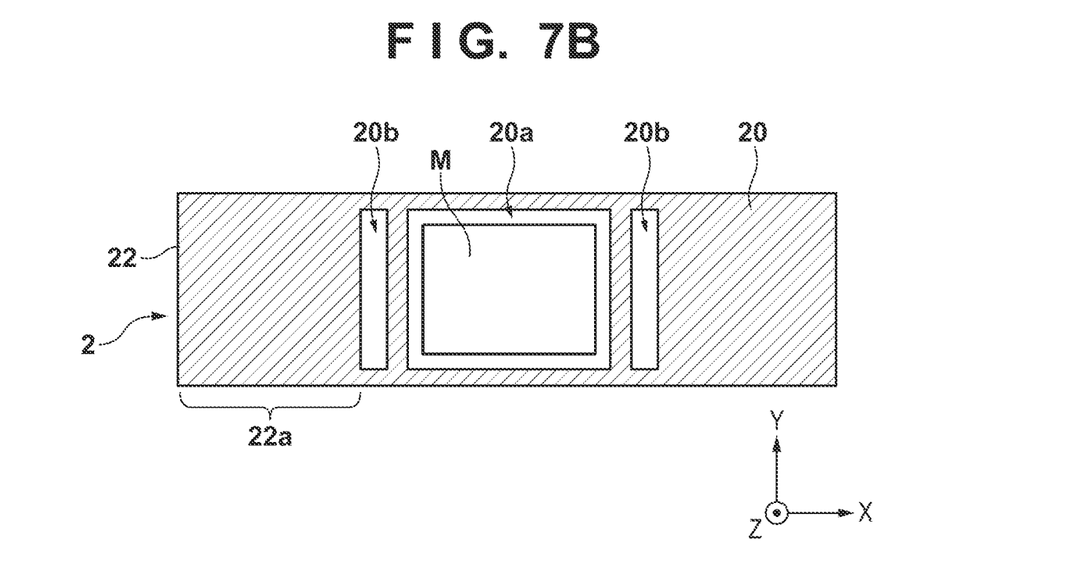

The fifth embodiment according to the present invention will be described. FIGS. 7A and 7B are views showing the peripheral arrangement of an original stage 2 in an exposure apparatus 500 of this embodiment. FIG. 7A is a view showing the peripheral arrangement (X-Z section) of the original stage 2 in the exposure apparatus 500, and an illumination optical system 1, the original stage 2, a projection optical system 3, a second plate 7, and supply units 8a are illustrated. FIG. 7B is a view of the original stage 2 of this embodiment as viewed from above (the +Z direction side). Note that the parts not particularly mentioned in the following description are similar to those in the first embodiment. Further, the arrangement of the original stage 2 is not limited to the arrangement described in the first embodiment, and the arrangement described in any one of the second to fourth embodiments may be applied.

The original stage 2 of this embodiment is provided with second supply units 8b, each of which supplies a purge gas to one of second concave portions 20b (second spaces). Each of the second supply units 8b may be configured to always supply the purge gas to the second concave portion 20b, or may be configured to supply the purge gas to the second concave portion 20b in a specific period. The specific period can be a period in which the original stage 2 is moving along the arrangement direction of a first concave portion 20a and the second concave portions 20b (that is, the scanning direction (±X directions)). With this arrangement, it is possible to supply the purge gas to the second concave portion 20b so as to make the air pressure in the second concave portion 20b higher than the air pressure outside the original stage 2, thereby reducing (preventing) the flow of the outside air into the first concave portion 20a.

Sixth Embodiment

Figure 8A:
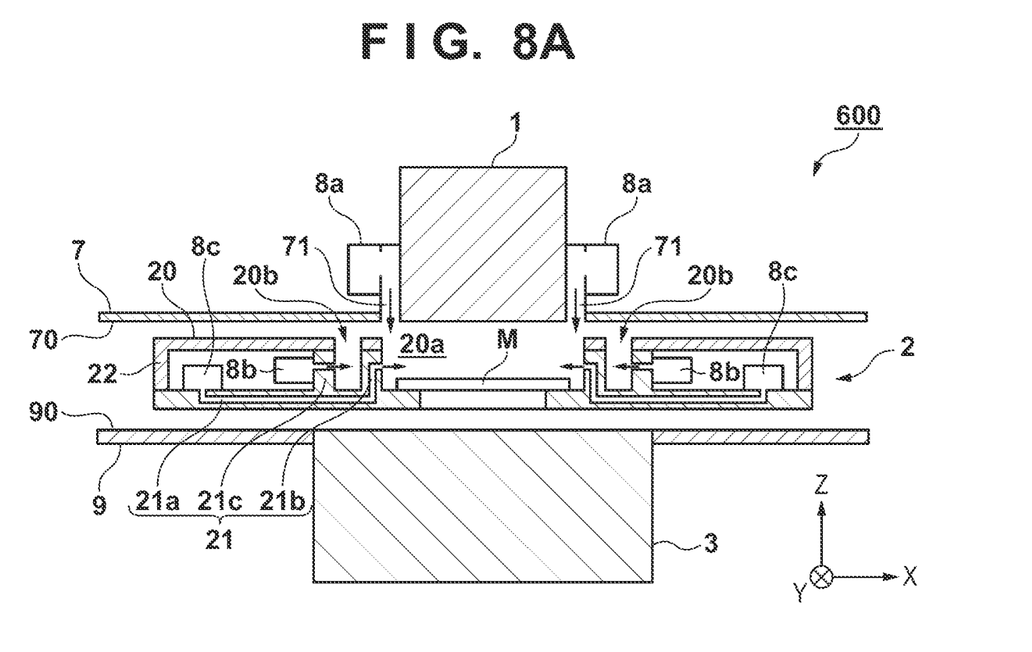
FIGS. 8A and 8B are views showing the peripheral arrangement of an original stage according to the sixth embodiment.
Figure 8B:
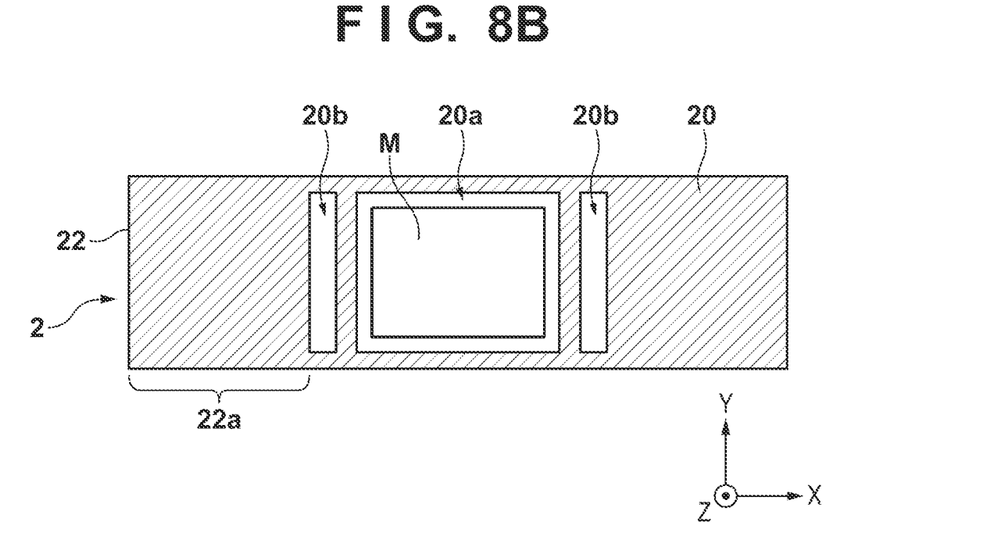

The sixth embodiment according to the present invention will be described. FIGS. 8A and 8B are views showing the peripheral arrangement of an original stage 2 in an exposure apparatus 600 of this embodiment. FIG. 8A is a view showing the peripheral arrangement (X-Z section) of the original stage 2 in the exposure apparatus 600, and an illumination optical system 1, the original stage 2, a projection optical system 3, a second plate 7, and supply units 8a are illustrated. FIG. 8B is a view of the original stage 2 of this embodiment as viewed from above (the +Z direction side). Note that the parts not particularly mentioned in the following description are similar to those in the fifth embodiment. Further, the arrangement of the original stage 2 is not limited to the arrangement described in the first embodiment, and the arrangement described in any one of the second to fourth embodiments may be applied.

In the original stage 2 of this embodiment, second supply units 8b, each of which supplies a purge gas to one of second concave portions 20b (second spaces) are provided, and third supply units 8c that supply the purge gas to a first concave portion 20a (first space) are further provided. In this embodiment, since the purge gas is supplied to the first concave portion 20a by the third supply units 8c, the supply units 8a that supply the purge gas to the first concave portion 20a by blowing out the purge gas from outlets 71 in the second plate 7 are not provided. Therefore, the arrangement of this embodiment is useful when, for example, the supply units 8a (outlets 71) cannot be provided in the second plate 7 due to the arrangement space or the like.

In this manner, by providing the third supply units 8c that supply the purge gas to the first concave portion 20a in the original stage 2, the flow rate of the purge gas supplied to the first concave portion 20a during movement of the original stage 2 (for example, during scanning exposure) can be kept constant. Therefore, the humidity distribution in the first concave portion 20a can be made uniform, and the amount of the purge gas used to fill the first concave portion 20a can be reduced.

Seventh Embodiment

The seventh embodiment according to the present invention will be described. In the first to sixth embodiments, there has been described the example in which a member (a second plate 7) including a second surface 70 is provided on the illumination optical system side of an original stage 2, and the upper surface of the original stage 2 is used as a first surface 20 to form a first concave portion 20a and a second concave portion 20b. On the other hand, the exposure apparatus may have an arrangement in which the lower surface of the original stage 2 is used as the first surface 20 to form the first concave portion 20a and the second concave portion 20b, and a member including the second surface facing the first surface 20 is provided on the projection optical system side of the original stage 2. In the exposure apparatus of this arrangement, for example, as shown in FIGS. 2A to 8B, a member (a plate 9) including a surface 90 as the second surface is provided on the projection optical system side of the original stage 2, for example. Then, the original stage 2 has an arrangement in which the upper side and the lower side are reversed with respect to the arrangements shown in FIGS. 2A to 8B. That is, the original stage 2 can be arranged such that the first surface 20 provided with the first concave portion 20a and the second concave portion 20b faces the surface 90 of the plate 9 provided in the projection optical system. Even in this arrangement, the same effects as in the first to sixth embodiments can be obtained.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming, using the above-described exposure apparatus, a latent image pattern on a photosensitive agent applied to a substrate (a step of exposing the substrate), and a step of developing (processing) the substrate with the latent image pattern formed in the above step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, quality, productivity, and production cost of the article, as compared with a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-169120 filed on Sep. 10, 2018, and Japanese Patent Application No. 2019-096250 filed on May 22, 2019, which are hereby incorporated by reference herein in their entirety.

What is claimed is:

1. An exposure apparatus which exposes a substrate while scanning an original and the substrate, comprising:
a stage that includes a first surface in which a first concave portion and a second concave portion to be supplied with a purge gas are formed, and is movable while holding the original;
a member that includes a second surface facing the first surface;
a supply unit configured to supply the purge gas to the first concave portion and the second concave portion by blowing out the purge gas from an outlet provided in the second surface of the member; and
a controller configured to control exposure of the substrate by moving the stage in a scanning direction,
wherein the first concave portion is provided in the first surface of the stage so as to define a first space in which the original is arranged, and the second concave portion is provided in the first surface of the stage so as to define a second space having a smaller volume than the first space, and
wherein the first concave portion and the second concave portion are arranged side by side in the scanning direction.

2. The apparatus according to claim 1, wherein a length of the second concave portion in the scanning direction is smaller than a length of the second concave portion in a direction perpendicular to the scanning direction and parallel to the first surface.

3. The apparatus according to claim 1, wherein in the direction perpendicular to the scanning direction and parallel to the first surface, the length of the second concave portion is not less than a length of the first concave portion.

4. The apparatus according to claim 1, wherein a distance between the first surface and the second surface is smaller than the length of the second concave portion in the scanning direction.

5. The apparatus according to claim 1, wherein the first surface of the stage has a groove portion which is provided on a direction side perpendicular to the scanning direction and is continuous with the second concave portion.

6. The apparatus according to claim 1, wherein on the first surface of the stage, a region outside the second concave portion includes a portion in which the distance between the first surface and the second surface is smallest.

7. The apparatus according to claim 1, wherein each of the first concave portion and the second concave portion has a depth not less than a thickness of the original.

8. The apparatus according to claim 1, wherein the depth of the second concave portion is not more than the depth of the first concave portion.

9. The apparatus according to claim 1, wherein in the first surface, a third concave portion is provided so as to define a space having a smaller volume than the first concave portion, and
wherein the second concave portion and the third concave portion are arranged side by side in the scanning direction.

10. The apparatus according to claim 1, further comprising a supply unit configured to supply the purge gas to the first concave portion and the second concave portion during movement of the stage by blowing out the purge gas from an outlet provided in the second surface of the member.

11. The apparatus according to claim 1, wherein the supply unit is configured to supply the purge gas to the first concave portion and the second concave portion during movement of the stage.

12. The apparatus according to claim 11, further comprising a third supply unit provided in the stage and configured to supply a purge gas to the first concave portion.

13. The apparatus according to claim 1, further comprising an illumination optical system configured to illuminate the original,
wherein the member is provided on the illumination optical system a with respect to the stage.

14. The apparatus according to claim 1, further comprising a projection optical system configured to project a pattern of the original onto the substrate,
wherein the member is provided on the projection optical system a with respect to the stage.

15. A method of manufacturing an article, the method comprising:
exposing a substrate using an exposure apparatus;
developing the exposed substrate; and
processing the developed substrate to manufacture the article,
wherein the exposure apparatus exposes the substrate while scanning an original and the substrate, and includes:
a stage that includes a first surface in which a first concave portion and a second concave portion to be supplied with a purge gas are formed, and is movable while holding the original;
a member that includes a second surface facing the first surface; and
a controller configured to control exposure of the substrate by moving the stage in a scanning direction,
wherein the first concave portion is provided in the first surface of the stage so as to define a first space in which the original is arranged, and the second concave portion is provided in the first surface of the stage so as to define a second space having a smaller volume than the first space, and
wherein the first concave portion and the second concave portion are arranged side by side in the scanning direction.

16. A method of manufacturing an article, the method comprising:
exposing a substrate using an exposure apparatus;
developing the exposed substrate; and
processing the developed substrate to manufacture the article,
wherein the exposure apparatus exposes the substrate while scanning an original and the substrate, and includes:
a stage that includes a first surface in which a first concave portion and a second concave portion to be supplied with a purge gas are formed, and is movable while holding the original;
a member that includes a second surface facing the first surface;
a supply unit configured to supply the purge gas to the first concave portion and the second concave portion by blowing out the purge gas from an outlet provided in the second surface of the member; and
a controller configured to control exposure of the substrate by moving the stage in a scanning direction,
wherein the first concave portion is provided in the first surface of the stage so as to define a first space in which the original is arranged, and the second concave portion is provided in the first surface of the stage so as to define a second space having a smaller volume than the first space, and
wherein the first concave portion and the second concave portion are arranged side by side in the scanning direction.

17. An exposure apparatus which exposes a substrate while scanning an original and the substrate, comprising:
a stage that includes a first surface in which a first concave portion and a second concave portion to be supplied with a purge gas are formed, and is movable while holding the original; and
a member that includes a second surface facing the first surface;
a supply unit configured to supply the purge gas to the first concave portion and the second concave portion by blowing out the purge gas from an outlet provided in the second surface of the member; and
a controller configured to control exposure of the substrate by moving the stage in a scanning direction,
wherein the first concave portion is provided in the first surface of the stage so as to define a first space in which the original is arranged, and the second concave portion is provided in the first surface of the stage so as to define a second space having a smaller volume than the first space,
wherein the first concave portion and the second concave portion are arranged side by side in the scanning direction, and
wherein the controller is configured to control movement of the stage such that when starting exposure of the substrate by moving the stage in the scanning direction, the second concave portion is arranged at a position of the outlet in the scanning direction and the purge gas blown out from the outlet is supplied into the second concave portion.

18. The apparatus according to claim 17, wherein
the second surface of the member has a second outlet for blowing out a purge gas, and
the second outlet is provided on the scanning direction side with respect to the optical system, such that the purge gas blown out from the second outlet is supplied into the second concave portion during the exposure of the substrate by moving the stage in the scanning direction.

19. The apparatus according to claim 16, wherein the purge gas blown out from the outlet is supplied into the first concave portion during the exposure of the substrate by moving the stage in the scanning direction.

20. The apparatus according to claim 1, wherein the first concave portion and the second concave portion are formed in the first surface of the stage so as to be separated from each other in the scanning direction.

21. An exposure apparatus which exposes a substrate while scanning an original and the substrate, comprising:
a stage that includes a first surface in which a first concave portion and a second concave portion to be supplied with a purge gas are formed, and is movable while holding the original; and
a member including that includes a second surface facing the first surface; and
a supply unit configured to supply the purge gas to the first concave portion and the second concave portion by blowing out the purge gas from an outlet provided in the second surface of the member; and
a controller configured to control exposure of the substrate by moving the stage in a scanning direction,
wherein the first concave portion is provided in the first surface of the stage so as to define a first space in which the original is arranged, and at least one the second concave portion is provided outside the first concave portion in the first surface of the stage so as to define a second space having a smaller volume than the first space, and wherein the first concave portion and the second concave portion are arranged side by side in the scanning direction, wherein the outlet and the second concave portion are faced to each other when the stage is arranged at a first position in a movable region of the stage in the scanning direction.

22. The apparatus according to claim 21, wherein the outlet and the first concave portion are facing each other when the stage is arranged at a second position, different from the first position, in the movable region of the stage in the scanning direction.

23. A method of manufacturing an article, the method comprising:

exposing a substrate using an exposure apparatus;

developing the exposed substrate; and processing the developed substrate to manufacture the article, wherein the exposure apparatus exposes the substrate while scanning an original and the substrate, and includes:

a stage that includes a first surface in which a first concave portion and a second concave portion to be supplied with a purge gas are formed, and is movable while holding the original; and a member that includes a second surface facing the first surface;

a supply unit configured to supply the purge gas to the first concave portion and the second concave portion by blowing out the purge gas from an outlet provided in the second surface of the member; and a controller configured to control exposure of the substrate by moving the stage in a scanning direction, wherein the first concave portion is provided in the first surface of the stage so as to define a first space in which the original is arranged, and the second concave portion is provided in the first surface of the stage so as to define a second space having a smaller volume than the first space, and wherein the first concave portion and the second concave portion are arranged side by side in the scanning direction, wherein the controller is configured to control movement of the stage such that when starting exposure of the substrate by moving the stage in the scanning direction, the second concave portion is arranged at a position of the outlet in the scanning direction and the purge gas blown out from the outlet is supplied into the second concave portion.

24. A method of manufacturing an article, the method comprising:

exposing a substrate using an exposure apparatus;

developing the exposed substrate; and processing the developed substrate to manufacture the article, wherein the exposure apparatus exposes the substrate while scanning an original and the substrate, and includes:

a stage that includes a first surface in which a first concave portion and a second concave portion to be supplied with a purge gas are formed, and is movable while holding the original; and a member that includes a second surface facing the first surface;

a supply unit configured to supply the purge gas to the first concave portion and the second concave portion by blowing out the purge gas from an outlet provided in the second surface of the member; and a controller configured to control exposure of the substrate by moving the stage in a scanning direction, wherein the first concave portion is provided in the first surface of the stage so as to define a first space in which the original is arranged, and the second concave portion is provided in the first surface of the stage so as to define a second space having a smaller volume than the first space, and wherein the first concave portion and the second concave portion are arranged side by side in the scanning direction, wherein the outlet and the second concave portion are faced to each other when the stage is arranged at a first position in a movable region of the stage in the scanning direction.

* * * * *